United States Patent
Robinson

(10) Patent No.: US 10,116,282 B2
(45) Date of Patent: Oct. 30, 2018

(54) MULTI-FUNCTION FREQUENCY CONTROL DEVICE

(71) Applicant: Rakon Limited, Auckland (NZ)

(72) Inventor: Brent John Robinson, Auckland (NZ)

(73) Assignee: RAKON LIMITED, Auckland (NZ)

( * ) Notice: Subject to any disclaimer, the term of this patent is extended or adjusted under 35 U.S.C. 154(b) by 603 days.

(21) Appl. No.: 14/434,222

(22) PCT Filed: Oct. 8, 2013

(86) PCT No.: PCT/NZ2013/000186
§ 371 (c)(1),
(2) Date: Apr. 8, 2015

(87) PCT Pub. No.: WO2014/058328
PCT Pub. Date: Apr. 17, 2014

(65) Prior Publication Data
US 2015/0280686 A1    Oct. 1, 2015

Related U.S. Application Data

(60) Provisional application No. 61/710,938, filed on Oct. 8, 2012.

(51) Int. Cl.
| | |
|---|---|
| *H03H 9/10* | (2006.01) |
| *H03H 9/08* | (2006.01) |
| *H03H 9/05* | (2006.01) |
| *G01K 1/14* | (2006.01) |
| *H03B 5/32* | (2006.01) |
| *G01K 7/22* | (2006.01) |
| *G01K 11/26* | (2006.01) |
| *H03H 9/205* | (2006.01) |

(52) U.S. Cl.
CPC .............. *H03H 9/08* (2013.01); *G01K 1/14* (2013.01); *G01K 7/22* (2013.01); *G01K 11/26* (2013.01); *H03B 5/326* (2013.01); *H03H 9/0547* (2013.01); *H03H 9/0552* (2013.01); *H03H 9/1007* (2013.01); *H03H 9/205* (2013.01); *H03H 9/1021* (2013.01); *H03H 9/1057* (2013.01); *H03H 9/1071* (2013.01)

(58) Field of Classification Search
CPC ........................................................ H03L 1/022
USPC .......................................... 310/346; 331/176
See application file for complete search history.

(56) References Cited

U.S. PATENT DOCUMENTS

| | | | | |
|---|---|---|---|---|
| 4,616,194 | A * | 10/1986 | Renoult | H03B 5/362 331/116 R |
| 8,629,673 | B1 * | 1/2014 | Xie | G01R 21/02 324/105 |
| 2003/0080819 | A1 * | 5/2003 | Jiles | H03B 5/04 331/176 |

(Continued)

FOREIGN PATENT DOCUMENTS

WO    2004091100    10/2004

*Primary Examiner* — J. San Martin
(74) *Attorney, Agent, or Firm* — Dann, Dorfman, Herrell and Skillman, P.C.

(57) ABSTRACT

A single frequency control device incorporating a high frequency resonator, a low frequency resonator and a temperature sensing element, the latter thermally coupled closely to the said resonators to facilitate temperature sensing with higher resolution and accuracy. Additional benefits offered by the structure include smaller size and lower cost.

29 Claims, 2 Drawing Sheets

(56) References Cited

U.S. PATENT DOCUMENTS

| | | | | |
|---|---|---|---|---|
| 2005/0007205 A1* | 1/2005 | Bridger | ................... | H03B 5/36 |
| | | | | 331/108 C |
| 2009/0115542 A1* | 5/2009 | Nakamura | ............... | H03B 5/04 |
| | | | | 331/176 |
| 2014/0253392 A1* | 9/2014 | Yarga | ................... | H01Q 5/328 |
| | | | | 343/702 |
| 2017/0155393 A1* | 6/2017 | Hattori | ................... | H03B 5/32 |

* cited by examiner

MULTI-FUNCTION FREQUENCY CONTROL DEVICE

REFERENCE TO PRIOR APPLICATION

This application claims the benefit of U.S. Provisional Application No. 61/710,938, filed Oct. 8, 2012.

FIELD OF INVENTION

The present invention relates generally to frequency control devices and, in particular, to frequency control devices that deploy high and low frequency resonators and temperature sensing elements.

DESCRIPTION OF THE RELATED ART

Contemporary electronic devices utilize several frequency reference components deployed to facilitate various communication functions such as cellular communications, GPS, Wi-Fi, Bluetooth, etc. The said frequency reference components commonly include high frequency resonators and real-time clock (RTC) resonators.

In order to minimize frequency instability caused by changing ambient temperature, the high frequency resonator is often packaged together with a temperature sensing component (such as a thermistor or a diode), the latter used to sense the high frequency resonator's temperature and work out the actual resonator's frequency at that temperature. This method of computational frequency correction requires high resolution expensive analog-to-digital convertors for converting the temperature sensing voltage. When attempting to minimize the RTC frequency instability using the temperature sensing and computational correction method, one encounters the additional difficulty presented by the difference between the temperature of the RTC resonator and that of the temperature sensing element.

SUMMARY OF THE INVENTION

The present invention provides a single structure that incorporates three elements—a high frequency resonator, a low frequency resonator and a temperature sensing element, and wherein all three elements are closely thermally coupled so that the temperature difference between any of the three elements is further reduced. Such a structure offers the following advantages:

it facilitates improved accuracy of temperature sensing and improved resolution of temperature sensing, it eliminates the need for expensive high resolution analog-to-digital convertors;

it offers reduced physical size and reduced cost.

DESCRIPTION OF PREFERRED EMBODIMENTS

The embodiments presented herein are examples of possible implementations of the present invention. The disclosed embodiments do not limit the scope of the present invention, the said scope described in the Claims section of this disclosure.

Figure 1:
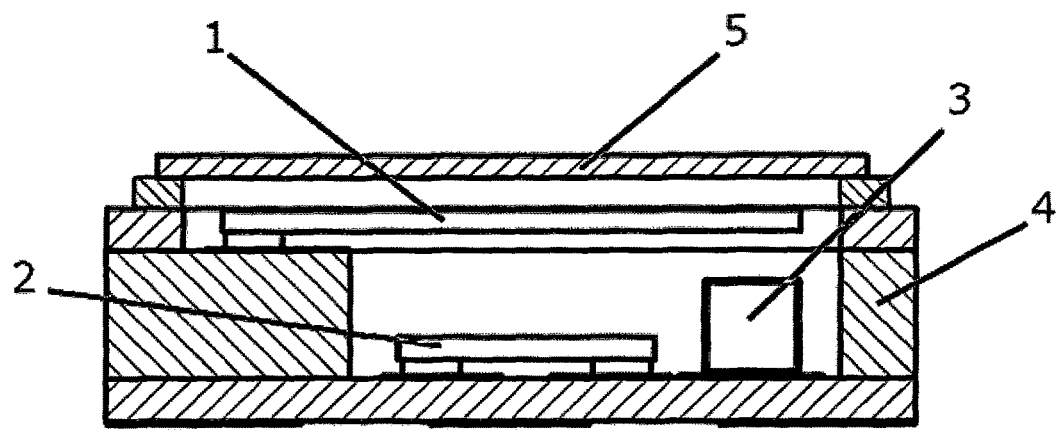
FIG. 1 is a cross-sectional view of the frequency control device provided by the present invention, wherein the high frequency resonator, the low frequency resonator and the temperature sensing element are located within the same hermetic cavity.

Referring to FIG. 1, the device presented by this invention is shown as implemented using a single multi-layer ceramic package that houses the three elements—the high frequency resonating element 1, the low frequency resonating element 2 and the temperature sensing element 3—all three elements positioned within the same hermetic cavity comprised of the ceramic package 4 and the lid 5. Preferably, the resonating element 1 is an AT-cut quartz crystal, the resonating element 2 is a 32.768 kHz tuning fork crystal, and the temperature sensing element 3 is a thermistor. Alternatively, other types of high and low frequency resonators can be used instead, such as an SC-cut crystal, a surface acoustic wave (SAW) resonating element, or a MEMS resonator; also, the temperature sensing element can be alternatively implemented as a diode, a dedicated temperature sensing integrated circuit, or a resonating element whose resonant frequency is sensitive to temperature (such as, for example, a Y-cut quartz crystal).

Figure 2:
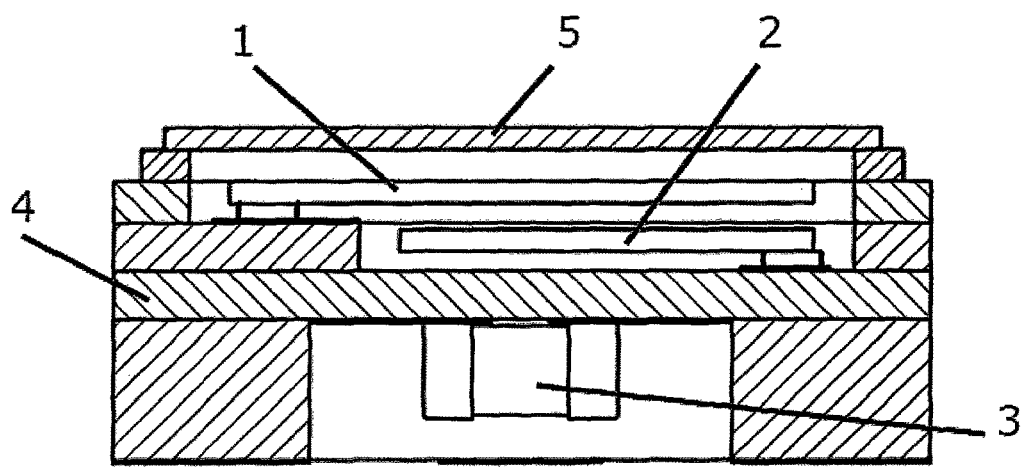
FIG. 2 is a cross-sectional view of the frequency control device provided by the present invention, wherein the high frequency resonator and the low frequency resonator are located within the same hermetic cavity, and the temperature sensing element is placed in a non-hermetic part of the structure.

Referring to FIG. 2, the device shown is implemented by positioning the three elements in separate cavities of a ceramic package 4: the high and low frequency resonating elements 1 and 2 are located in a hermetic cavity that is closed off by the lid 5, whereas the temperature sensing element 3 is located in a non-hermetic cavity in the lower part of the package 4.

Figure 3:
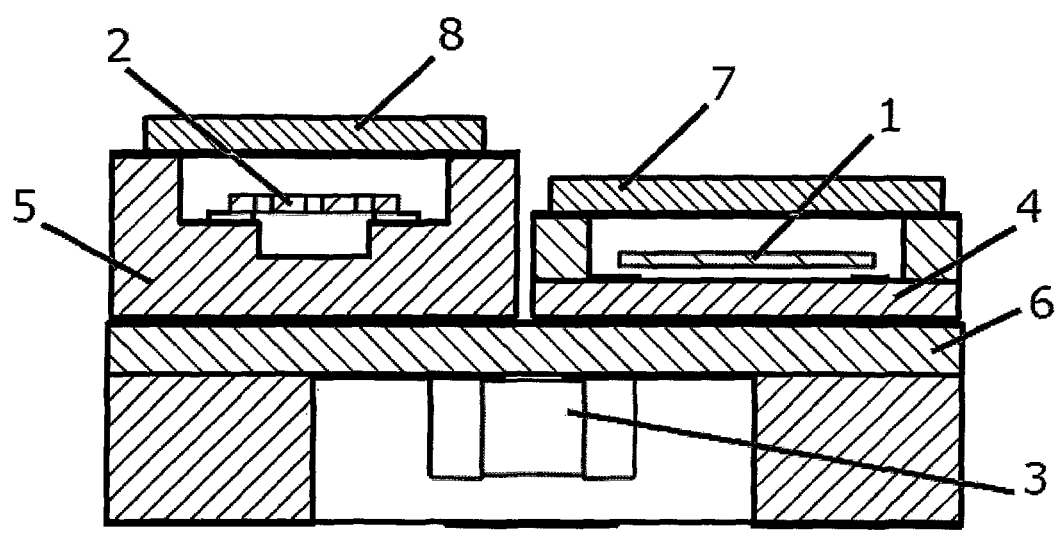
FIG. 3 is a cross-sectional view of the frequency control device provided by the present invention, wherein the high frequency resonator, the low frequency resonator and the temperature sensing element are housed in separate packages, the latter then assembled into a single component.

In some situations, it may be more convenient to use readily available "standard" packaged high and/or low frequency resonators as in an embodiment shown in FIG. 3. Therein, both the high and low frequency resonating elements (1 and 2 correspondingly) and enclosed in separate hermetic ceramic packages 4 and 5 closed off by lids 7 and 8; the temperature sensing element 3 is positioned in the cavity of the ceramic package 6 and the whole device is assembled by soldering the packaged resonating elements onto the ceramic package 6.

Other construction variants are of course possible, and a person skilled in the art will be able to develop other structures without deviating from the scope of the present invention.

The close spatial proximity and the resulting thermal coupling between the three elements allow a more accurate and more efficient sensing of temperature of the two resonating elements 1 and 2, as the said temperature sensing is done through the use of a single temperature sensing element 3 and a single measurement (or a single series of measurements pertaining to both resonating elements 1 and 2). The ability to use a single temperature sensing measurement for both resonating elements reduces power consumption in the application system.

The close spatial proximity and the resulting thermal coupling between the three elements offer an additional advantage: the presented by this invention structure facilitates a higher resolution and cheaper temperature sensing method whereby the frequency of the low frequency resonating element (e.g., a tuning fork crystal) is used as an indication of temperature of the device. In this method, the frequency of the low frequency resonating element (e.g., a tuning fork crystal) is measured using the high frequency resonating element's signal (AT-cut crystal's frequency) as a reference frequency. In this scheme, the need for high-resolution analog-to-digital convertor required for temperature sensing using a thermistor, is eliminated since the thermistor will only be used for an approximate determination of temperature in order to determine which half of the parabolic F(T) curve of the tuning fork resonator the current temperature point "belongs" to.

What is claimed is:

1. A frequency control device, constructed as a single component, comprising at least three thermally coupled elements: a first resonating element whose resonant frequency is within the HF band or higher, a second resonating element whose resonant frequency is within the LF band or lower, and a temperature sensing element, and wherein, in addition to facilitating the generation of high frequency and low frequency signals, the said resonating elements allow, when used in conjunction with the said temperature sensing element, for high resolution determination of the said device's temperature.

2. A frequency control device as in claim 1 wherein the said first resonating element and the said second resonating element are located in a common hermetically sealed cavity.

3. A frequency control device as in claim 1 wherein the said first resonating element and the said second resonating element are located in separate hermetically sealed cavities.

4. A frequency control device as in claim 1 wherein the temperature sensing element is located in a separate cavity.

5. A frequency control device as in claim 1 wherein the said first resonating element, the said second resonating element, and the temperature sensing element are located in a common hermetically sealed cavity.

6. A frequency control device as in claim 1 wherein the said single component comprises a multi-layer ceramic package.

7. A frequency control device as in claim 1 wherein the said first resonating element is a quartz crystal resonating element.

8. A frequency control device as in claim 7 wherein the said first resonating element is a Bulk Acoustic Wave resonating element.

9. A frequency control device as in claim 8 wherein the said first resonating element is an AT-cut crystal resonating element.

10. A frequency control device as in claim 8 wherein the said first resonating element is an SC-cut crystal resonating element.

11. A frequency control device as in claim 1 wherein the said first resonating element is a Surface Acoustic Wave resonating element.

12. A frequency control device as in claim 1 wherein the said first resonating element is a MEMS resonating element.

13. A frequency control device as in claim 1 wherein the said second resonating element is a quartz crystal resonating element.

14. A frequency control device as in claim 13 wherein the said second resonating element is a Tuning Fork crystal resonating element.

15. A frequency control device as in claim 1 wherein the said second resonating element is a MEMS resonating element.

16. A frequency control device as in claim 1 wherein the said temperature sensing element comprises a thermistor.

17. A frequency control device as in claim 1 wherein the said temperature sensing element comprises at least one semiconductor diode.

18. A frequency control device as in claim 1 wherein the said temperature sensing element comprises at least one semiconductor transistor.

19. A frequency control device as in claim 1 wherein the said temperature sensing element comprises a semiconductor temperature sensing circuit.

20. A frequency control device as in claim 1 wherein the said temperature sensing element is a resonating element whose resonant frequency is sensitive to temperature.

21. An electronic device which comprises a frequency control device according to claim 1 and which is arranged to use both the output of the said temperature sensing element and the output frequency of the said second low frequency resonating element in correcting for deviation in the output frequency of the said first high frequency resonating element due to temperature variations.

22. An electronic device according to claim 21 arranged to determine the output frequency of the said second low frequency resonating element using the output frequency of the said first high frequency resonating element as a frequency measurement reference.

23. An electronic device according to claim 21 which is a cellular communications device.

24. An electronic device according to claim 21 which is a satellite navigation system receiver.

25. An electronic device according to claim 21 which is a Wi-Fi capable device.

26. An electronic device according to claim 21 which is a Bluetooth capable device.

27. A method of improving the effective frequency stability implemented in an electronic device which comprises a first resonating element having a resonant frequency within the HF band or higher, a second resonating element having a resonant frequency within the LF band or lower, and a temperature sensing element, which method comprises using both an output of the said temperature sensing element and an output of the said second low frequency resonating element to correct for deviation in the output frequency of the said first or second resonating elements due to temperature variations.

28. A temperature sensing method according to claim 27 which includes determining the output frequency of the said second low frequency resonating element using the output frequency of the said first high frequency resonating element as a frequency measurement reference.

29. A method of high resolution sensing of the temperature of a frequency control device constructed as a single component and comprising at least three thermally coupled elements—a first resonating element whose resonant frequency is within the HF band or higher, a second resonating element whose resonant frequency is within the LF band or lower, and a temperature sensing element, —the method comprising the following steps:

measuring the frequency of the said second resonating element, using the frequency of the said first resonating element as a frequency measurement reference, measuring the output of the said temperature sensing element, combining the values measured in the above steps to obtain a high resolution indication of the device's temperature.

* * * * *